United States Patent
Scott et al.

[11] Patent Number: 6,121,811
[45] Date of Patent: *Sep. 19, 2000

[54] VARIABLE TIME DELAY CIRCUIT AND METHOD

[75] Inventors: Baker Scott, Austin, Tex.; Izumi Kawata, Kanagawa, Japan

[73] Assignee: Crystal Semiconductor Corporation, Austin, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/931,995

[22] Filed: Sep. 17, 1997

Related U.S. Application Data

[63] Continuation of application No. 08/536,982, Sep. 29, 1995, abandoned.

[51] Int. Cl.[7] ........................................ H03K 5/13
[52] U.S. Cl. ............................... 327/276; 327/281
[58] Field of Search .................... 327/263–266, 327/276–281, 231–234, 237, 250, 170, 175, 131, 132, 134, 136

[56] References Cited

U.S. PATENT DOCUMENTS

| | | | |
|---|---|---|---|
| 3,906,247 | 9/1975 | Heffner | 327/263 |
| 4,438,404 | 3/1984 | Philipp | 327/263 |
| 4,645,958 | 2/1987 | Suzuki et al. | 307/597 |
| 4,736,118 | 4/1988 | Fischer | 327/131 |
| 4,746,823 | 5/1988 | Lee | 327/263 |
| 5,015,892 | 5/1991 | Parsi et al. | 327/276 |
| 5,138,204 | 8/1992 | Imamura et al. | 327/263 |
| 5,175,452 | 12/1992 | Lupi et al. | 327/277 |
| 5,355,038 | 10/1994 | Hui | 327/276 |
| 5,379,321 | 1/1995 | Girmay | 327/175 |
| 5,382,921 | 1/1995 | Estrada et al. | 331/1 A |
| 5,502,419 | 3/1996 | Kawasaki et al. | 327/175 |

FOREIGN PATENT DOCUMENTS

| | | | |
|---|---|---|---|
| 2312314 | 12/1990 | Japan | 327/263 |
| 4-227313 | 8/1992 | Japan | 327/276 |
| 575409 | 3/1993 | Japan | 327/270 |

OTHER PUBLICATIONS

Brooktree®, "Bt601—20 ps Resolution 10KH ECL Compatible Dynamically Programmed Timing Edge Vernier," Brooktree Corporation, Chapter 7, 7–5–7–12.

IBM Technical Bulletin Disclosure, vol. 20, No. 12, May 1978 "Electronic Sequencer with Programable Time Delays" by H. A. Higuchi.

"Multiple Time Delay Generator", ETI Circuit Supplement vol. 10, No. 11, Nov. 1981.

*Primary Examiner*—Tuan T. Lam
*Attorney, Agent, or Firm*—Arnold White & Durkee; J. P. Violette

[57] ABSTRACT

A high resolution variable time delay circuit is disclosed. In one embodiment, a current digital to analog converter (DAC) is used to sequentially charge two capacitors having similar capacitance construction. A threshold level capacitor provides the threshold level to a comparator, and a ramping capacitor is used for ramping to the threshold to provide a delay time. The comparator provides a delayed pulse using the threshold level provided by the threshold level capacitor and the ramp provided by the ramping capacitor. Thus, resolution is better than that provided by digital elements alone. This circuit also automatically cancels errors due to capacitance variations and unit current variation of the DAC introduced during the manufacturing process. In another embodiment a single capacitor is used in combination with two current DACs and a comparator to provide a controllable time delay.

21 Claims, 4 Drawing Sheets

VARIABLE TIME DELAY CIRCUIT AND METHOD

This application is a continuation of application Ser. No. 08/536,982, filed Sep. 29, 1995, now abandoned.

BACKGROUND OF THE INVENTION

The present invention relates to a time delay circuit and method and more particularly to a circuit for creating a controllable time delay used in phase shifting a digital signal.

Data phase alignment circuitry, digital phase locked loops (PLL) and other digital circuits utilize variable time delay circuitry to achieve digital signal phase alignment, phase offset or sampling timing. One approach used for variable time delay is digital variable time delay circuitry that contains a programmable counter. The resolution of such circuits is generally limited by the clock speed. Increasing the frequency of the clock increases resolution, but the clock frequency is limited by the speed of the digital circuits. Also, the high frequency clock generally increases power consumption.

Another approach used for variable time delay utilizes an analog PLL with a ring oscillator containing M stages. Such an approach is illustrated in FIG. 1. Referring to FIG. 1, the analog PLL 10 locks to the reference signal 11 or data rate signal. The analog PLL 10 maintains the frequency as N* the data rate and generates M*N phases from the outputs of ring oscillator 12. Thus, the resolution is M*N using N* the data rate clock frequency. Increasing the number of stages M, increases the resolution since the resolution of this approach is limited by stage number M and the speed of phase selector 13. Typically, the delay of each path of phase selector 13 must be the same and increasing M makes the path matching difficult. When using the analog PLL approach, phase selector 13 can make narrow pulses when making large phase changes. Because the phase selector 13 and a divider 14 condition these pulses, the phase selector 13 and the divider 14 must work at much higher frequency than the N* data rate frequency. The speed limits of the phase selector 13 and divider 14 thus limit the resolution in this typical digital variable phase shift circuitry approach.

Thus, previous techniques have resolution limited by digital element speed and it would be desirable to have a variable time delay that achieves high resolution beyond the speed limitations described above.

SUMMARY OF THE INVENTION

A high resolution variable time delay circuit is disclosed. In one embodiment, a current digital to analog converter (DAC) is used to sequentially charge two capacitors having similar capacitance construction. A threshold level capacitor provides the threshold level to a comparator, and a ramping capacitor is used for ramping to the threshold to provide a delay time. The comparator provides a delayed pulse using the threshold level provided by the threshold level capacitor and the ramp provided by the ramping capacitor. To begin, the current DAC, which is set to provide current M, is used to charge up the threshold level capacitor for one clock time interval T to provide a desired threshold level. After charging, the voltage of the threshold level capacitor will be proportional to the DAC value M and charging time T. Then, the current DAC is set to another value F to charge up the ramping capacitor. During charging, the voltage of the ramping capacitor is ramping at a rate determined by DAC value F and charging time t. The comparator transitions when both capacitance voltages are the same. The delay time from the start time of the charging of the ramping capacitor will be determined by the equation M/F*T. The phase shift resolution is defined by the resolution of the current DAC times the clock period T divided by the reference signal cycle. If F is full scale and N is the clock multiplier of the reference clock, then the phase shift resolution is F*N. Clock speed T is limited by digital element speed, but the full scale value F is not limited by digital element speed. Thus, the resolution of the present invention is better than that provided by digital elements alone.

The circuitry of the present invention also automatically cancels errors due to capacitance voltage coefficient and full scale current variation of the DAC introduced during the manufacturing process.

Thus, the present invention provides a time delay free from the deleterious effects of capacitance absolute value and capacitance voltage coefficient, and free from the deleterious effects of low frequency variation or drift in the current DAC, as well as the effects of DAC current variation and capacitor value variation resulting from the manufacturing process.

In accordance with another embodiment of the invention, a single capacitor is used in combination with a pair of current DACs and a comparator to provide a controllable time delay. In this embodiment, one DAC is controlled to charge the capacitor at a controllable rate, and the other DAC is used to discharge the capacitor at a controllable rate. The resultant capacitor voltage is a saw-tooth waveform that is then compared to a predetermined threshold voltage by the comparator to produce the desired time delay.

The invention includes three basic elements (capacitor, current DAC and comparator) that are used to determine a desired time delay in such a way that the absolute values of the charging currents and capacitance do not affect the resolution or value of the desired time delay. The comparator delay is rendered consistent by using the full scale value of the DAC to charge the ramping capacitor, and the DAC and capacitance variations are canceled by using similar construction, or by using a single element. The circuit configuration of the present invention eliminates the need for calibration, and renders the determination of time delay insensitive to variations in power supply, temperature, manufacturing process, and low frequency drifts in DAC current.

In general, the variable-time delay circuit of the present invention, comprises: a first controllable current source; a first capacitor, connected to the first controllable current source, to provide a ramping voltage as a function of the first controllable current source; a comparator connected to the first capacitor, for comparing the ramping voltage with a threshold voltage, and for providing an output signal indicative of a desired time delay; and a control block, connected to the controllable current source and the first capacitor, for controlling the desired time delay by varying an amount of current applied by the controllable current source, and by controlling an initiation time for the charging of the first capacitor.

The invention may further comprise, a second capacitor, connected to the controllable current source and to the comparator, for providing a threshold voltage to the comparator, the control block additionally controlling the controllable current source to charge the second capacitor to provide a desired threshold voltage to the comparator.

The controllable current source preferably comprises, a current digital-to-analog converter.

The invention may further comprise, controllable switch means, controlled by the control block, for selectively connecting the controllable current source to the first capacitor to initiate charging of the first capacitor. When two capacitors are used, the controllable switch means is also controlled by the control block to selectively connect the controllable current source first to one capacitor to establish the threshold voltage, and then to the other capacitor to initiate the ramping voltage.

In accordance with an alternate embodiment of the invention a second controllable current source is connected to the first capacitor and is controlled by the control block, for controllably discharging the first capacitor after it has been charged by the first controllable current source. In this case, the ramping voltage is a saw-tooth waveform.

The method of the present invention comprises: establishing a threshold voltage; controllably charging a capacitor to produce a ramp voltage beginning at a charging initiation time; and comparing the ramp voltage to the threshold voltage to produce a controllable time delay between the ramp initiation time, at a time when the ramp voltage and the threshold voltage substantially equal one another.

The method may further comprise establishing the threshold by controllably charging a second capacitor to produce the threshold voltage.

These and other features and advantages of the present invention will become apparent to those of skill in this technology with reference to the following detailed description and appended drawings.

DETAILED DESCRIPTION

Figure 1:
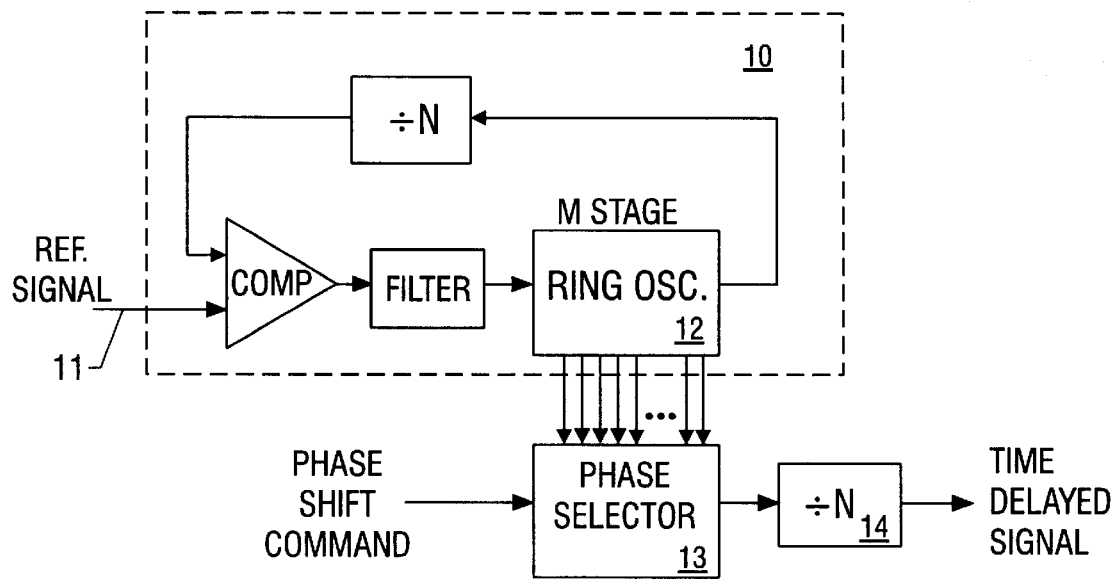
FIG. 1 is a prior art time delay circuit.
Figure 2A:
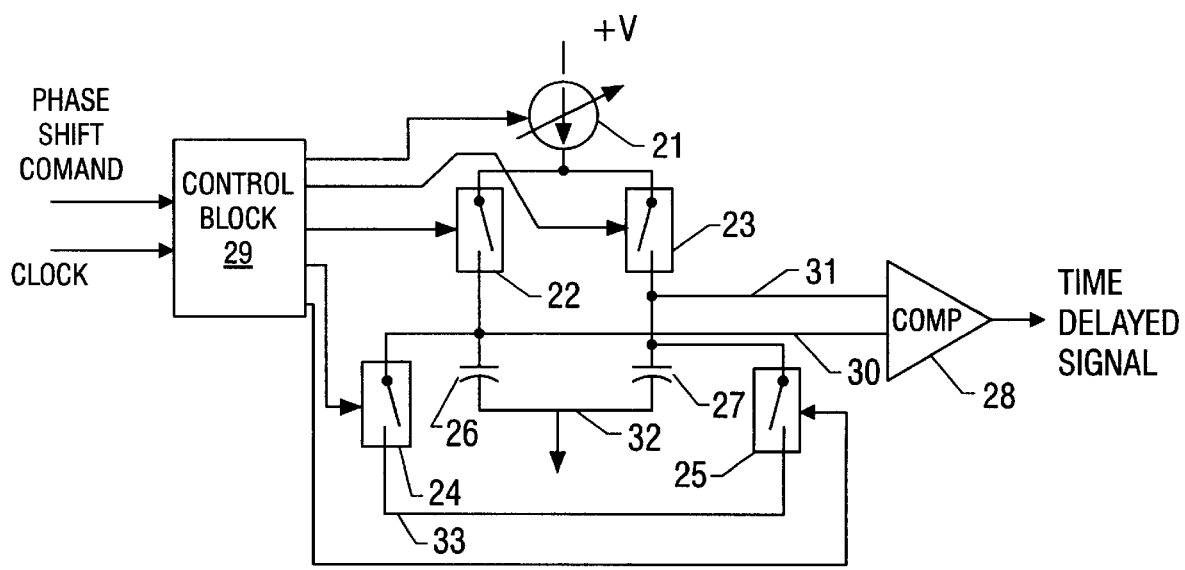
FIG. 2A is a high resolution time delay circuit in accordance with a first embodiment of the present invention.

An embodiment of a high resolution variable time delay circuit according to the present invention is illustrated in FIG. 2A. The time delay circuit includes a current DAC 21, switches 22, 23, 24 and 25, capacitors 26 and 27, comparator 28 and control block 29. Current DAC 21 is connected to switches 22, 23 which control DAC current flow to threshold level capacitor 26 or ramping capacitor 27. Threshold level capacitor 26 has a first terminal 30 connected to switch 22 and a second terminal connected to ground line 32. It should be noted that the second terminal of threshold level capacitor 26 may be connected to a constant voltage line, other than ground, if desired. Switch 24 is connected between the first terminal 30 of capacitor 26 and constant voltage line 33. It should be noted that constant voltage line 33 may be at ground or may be at a constant voltage other than ground, the voltage of the constant voltage line 33 being the desired initial voltage condition of capacitor 26. Ramping capacitor 27 has a first terminal 31 connected to switch 23 and a second terminal connected to ground line 32. It should be noted that the second terminal of ramping capacitor 27 may be connected to a constant voltage line other than ground if desired. Switch 25 is connected between first terminal 31 of capacitor 27 and constant voltage 33. Once again, it is noted that constant voltage line 33 may be at ground or may be at a constant voltage other than ground, the voltage of the constant voltage line 33 being determined by the desired initial voltage condition of capacitor 27.

Although the second terminals of capacitors 26, 27 are shown connected to a common voltage line 32, and switches 24, 25 are shown connected to a common voltage line 33, these may all be connected to a single voltage line or may all be connected to separate voltage lines, without departing from the scope of the invention.

Comparator 28 compares the voltages appearing on terminals 30 and 31 to produce a delayed pulse. Control block 29 controls DAC 21 and all switches 22, 23, 24, 25 to produce a delayed pulse according to the time delay command applied to command block 29.

Control block 29 receives a phase shift command which is generated in a known manner and which comprises up and down (advance and delay) phase shift information derived from two signals that are phase shifted relative to one another. Control block 29 accumulates the phase shift information in a known manner by, for example, incrementing or decrementing a value stored in an accumulator register depending upon whether the phase shift command indicates a phase advance or delay.

Figure 3:
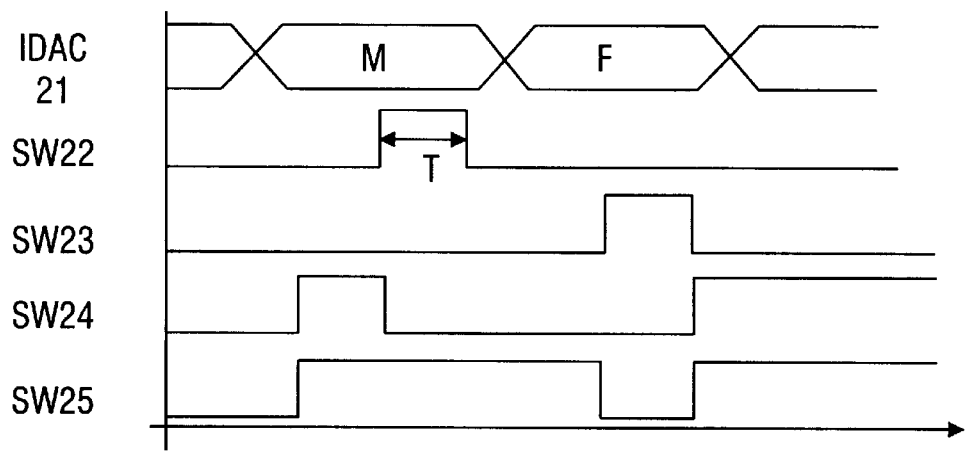
FIG. 3 is a set of signal timing charts illustrating one mode of operation of the circuit of FIG. 2A.
Figure 4:
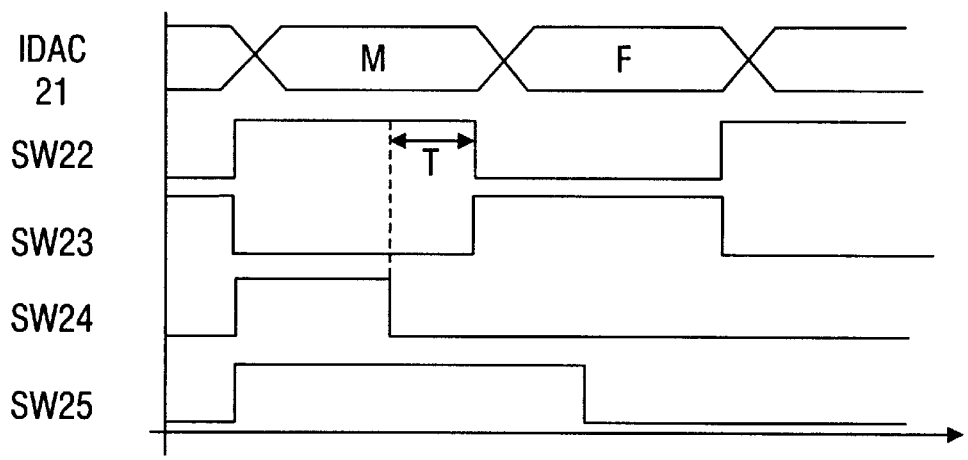
FIG. 4 is a set of signal timing charts illustrating another mode of operation of the circuit of FIG. 2A.

Control block 29 then outputs the appropriate value for DAC 21 (for example, the value stored in the accumulator), and outputs the control signals for switches 22, 23, 24, 25, in accordance with predetermined timing, illustrated, for example, in FIGS. 3 and 4.

Figure 2B:
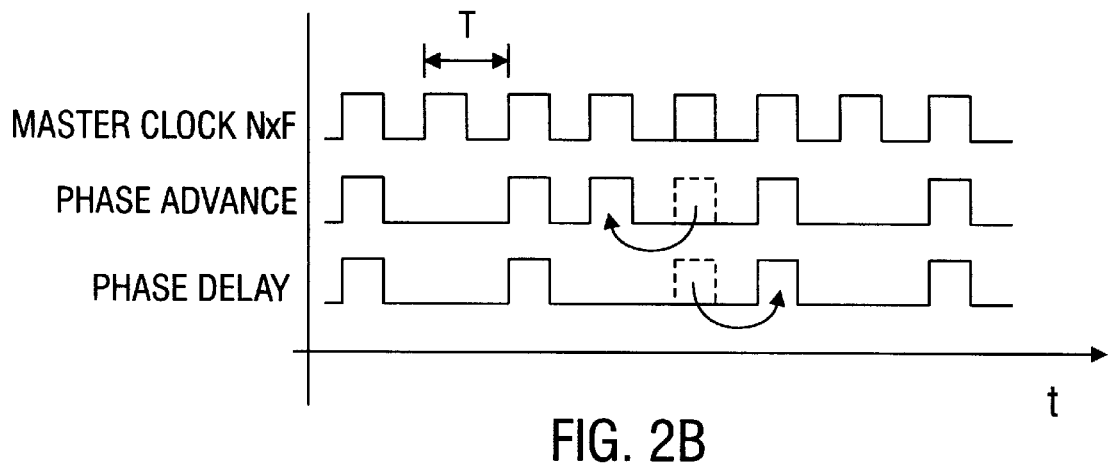
FIG. 2B is a timing chart illustrating the coarse time delay control of the present invention.

If the accumulator within control block 29 reaches a minimum value, control block 29 shifts the start time of the ramping capacitor 27 (corresponding to the closure of switch 23), from the previous start time to one T cycle ahead. Conversely, if the accumulator within control block 29 reaches a maximum value, control block 29 shifts the start time of the ramping capacitor 27 (corresponding to the closure of switch 23), from the previous start time to one T cycle delayed. This coarse control of delay time is illustrated by the timing charts shown in FIG. 2B. By this method, control block 29, in combination with the rest of the time delay circuitry shown in FIG. 2A, coarse adjusts time delay by shifting one (or more) T cycles ahead or behind, and makes a fine time delay adjustment using DAC 21, switches 22, 23, 24, 25 capacitors 26, 27 and comparator 28.

The rate at which the time delay circuit responds to desired phase changes may be adjusted by altering the characteristics of the accumulator within control block 29.

The invention includes three basic elements (capacitor, current DAC and comparator) that are used to determine a desired time delay in such a way that the absolute values of the charging currents and capacitance do not affect the resolution or value of the desired time delay. The comparator delay is rendered consistent by using the full scale value of the DAC to charge the ramping capacitor, and the DAC and capacitance variations are canceled by using similar construction, or by using a single element. The circuit configuration of the present invention eliminates the need for calibration, and renders the determination of time delay insensitive to variations in power supply, temperature, manufacturing process, and low frequency drifts in DAC current.

As explained in more detail below, the present invention provides a time delay free from the deleterious effects of capacitance absolute value and capacitance voltage coefficient, and free from the deleterious effects of low frequency variation or drift in the current DAC, as well as the effects of DAC current variation and capacitor value variation resulting from the manufacturing process.

In the following explanation of the operation of the illustrative embodiment shown in FIG. 2A, the voltages are relative to constant voltage line 32 (in this case, ground). Initially, both capacitors 26, 27 are charged at initial voltage X from node 33 through switches 24, 25. Then, current DAC 21 is set by control block 29 to provide a current of M*i (i being a unit current of DAC 21 and M being a digital number provided by control block 29). Control block 29 then closes switch 22 to charge up reference level capacitor 26 (having a value of value Ca) for a certain interval T to produce a desired threshold level on capacitor 26. After charging, voltage Vref of capacitor 26 will be $$Vref = \frac{M * i}{Ca} * T + X$$

Where T is the unit time or 1/ (master clock) to be interpolated. After charging capacitor 26, current DAC 21 is set by control block 29 to provide a current of F*i (F being a digital number provided by control block 29). Control block 29 then closes switch 23 to charge up capacitor 27 (having a value of Cb). The voltage Vramp of terminal 31 at time t measured from the closure of switch 23 is given by the equation:

$$Vramp = \frac{F * i}{Cb} * t + X$$

Comparator 28 will transition at time td when Vramp becomes equal to Vref. Time td is a controllable delay time measured from the closure of switch 23 and is given by the equation:

$$td = \frac{M}{F} * \frac{Cb}{Ca} * T$$

If Ca is equal to Cb, time td is:

$$td = \frac{M}{F} * T$$

This formula shows that delay time td is set by DAC 21 and charging time T of threshold level capacitor 26. Also, this equation shows that, by changing the ratio of DAC values M and F, delay time td will change. This provides a variable time delay which can be used as part of a variable phase shifter. The minimum time delay is:

$$tdmin = \frac{1}{F} * T$$

If the DAC value F is set at full scale for DAC 21, tdmin will be at its minimum and time delay resolution will be at its maximum. If charging time T is N times shorter than target signal cycle U, the minimum time delay tdmin is $$tdmin = \frac{1}{F} * \frac{U}{N}$$

The resolution of the time delay is $$\frac{U}{tdmin} = F * N$$

N is limited by the speed of the digital elements. This circuit has a resolution limitation by F times digital element speed limitation. Thus the resolution of the present invention is many times better than the digital element speed.

FIG. 3 is an example of control timing of switches 22, 23, 24, 25 and DAC 21 shown in FIG. 2A, in accordance with the illustrated embodiment. The top trace indicates the timing of the application of either M or F to DAC 21 by control block 29, and the bottom four traces indicate the timing of the activation of switches 22, 23, 24 and 25 by control block 29.

One of the advantages of the present invention is the insensitivity to process variation effects on the capacitance values for capacitors 26 and 27 and on the unit current i of DAC 21. This is because the threshold level voltage is a function of the relative values of capacitors 26 and 24 and the value of unit current i of DAC 21 multiplied by an integer number.

It is not required that DAC 21 charge capacitors 26 and 27. Alternatively, discharging capacitors 26 and 27 from an initial voltage is also acceptable to accomplish the same function.

Capacitors 26 and 27 may be replaced by MOS transistors. In this case the gate terminals of the MOS transistors would be connected to switches 22 and 24 or 23 and 25, respectively, and the drain and source terminals would be connected together and to constant voltage line 32. The non-linear gate capacitance of a MOS transistor is canceled out by the present invention. To provide an example, assume that when the voltage of nodes 30 and 31 is under threshold Vt, the MOS gate capacitance is Cx, and when the voltage of nodes 30 and 31 above Vt the MOS gate capacitance is Cy. If the charging of the threshold level capacitor is stopped before the voltage reaches Vt, the reference voltage is:

$$Vref = \frac{M * i}{Cx} * T + X$$

In addition, the voltage on the ramping capacitor is $$Vramp = \frac{F * i}{Cx} * t + X$$

In this instance, the threshold level capacitor and the ramping capacitor have the same capacitance Cx. Time td from the closure of switch 23 until Vramp is equal to Vref is $$td = \frac{M}{F} * T$$

When the voltage on nodes 30 and 31 is above Vt, each capacitor has a value of Cy, and the reference voltage Vref may be expressed as:

$$Vref = \frac{M*i}{Cx}*T1 + \frac{M*i}{Cy}*T2 + X$$

Here, T=T1+T2, where T1 is the time required for the MOS gate capacitance of the threshold level capacitor to charge to Vt and T2 is the charging time of this capacitance after Vt has been exceeded. Thus:

$$Vt = \frac{M*i}{Cx}*T1$$

In this case the ramp voltage Vramp may be expressed as:

$$Vramp = \frac{F*i}{Cx}*t1 + \frac{F*i}{Cy}*t2 + X$$

Here, t=t1+t2, where t1 is the time required for the MOS gate capacitance of the ramping capacitor to charge to Vt, and t2 is the charging time of this capacitance after Vt has been exceeded. Thus:

$$Vt = \frac{F*i}{Cx}*t1$$

$$t1 = \frac{Cx}{F*i}*Vt$$

$$= \frac{M}{F}*T1$$

Time td from the closure of switch 23 until Vramp is equal to Vref may be expressed as:

$$td = \frac{M}{F}*T2 + t1$$

$$= \frac{M}{F}*T2 + \frac{M}{F}*T1$$

$$= \frac{M}{F}*(T1 + T2)$$

$$= \frac{M}{F}*T$$

These formulas show that regardless of whether the voltages on the gate capacitances of the ramping and threshold level capacitors are above or below Vt, the present invention maintains constant resolution. If the capacitors 26 and 27 used for setting the threshold level and ramp are of similar construction (whether they are conventional capacitors or MOS gate capacitances), the linearity of capacitance as a function of voltage does not matter. Both capacitors can be thought of as integrating charge from the current DAC 21. The capacitor voltage will be the same when the charge on the two capacitors are the same. Thus, the present invention is independent of the linearity of the capacitors.

Switches 22, 23, 24 and 25 may also be MOS transistors. If the charge injection from the MOS switches is large, the threshold voltage level will be larger. By changing the DAC value M to compensate for the charge injection, erroneous transition of comparator 28 may be avoided. Including the effects of charge injection c, the reference voltage Vref may be expressed as:

$$Vref = \frac{M*i}{Ca}*T + \frac{C*i}{Ca}*T + X$$

and the ramping voltage Vramp may be expressed as:

$$Vramp = \frac{F*i}{Cb}*t + X$$

Here, capacitance Ca and Cb have the same value. Time t from the closure of switch 25 for the ramping capacitor is:

$$t = \frac{M}{F}*T + \frac{c}{F}*T$$

If c is constant, $$t = \frac{M}{F}*T + \text{constant delay}$$

Thus, time t will have an offset, but resolution remains the same as before.

If the ratio of capacitance Ca and Cb is A, the resolution may be expressed as:

$$td = \frac{M}{F}*T*A$$

$$\text{Here } A = \frac{Cb}{Ca}$$

This formula shows increasing capacitance ratio A increases resolution. This relationship is also true when using MOS capacitance.

If F is at full scale, in order to make a delay more than T, the start time of the charging of ramping capacitor 27 (corresponding to the closure of switch 23) must be delayed by one T cycle delayed start time. If DAC 21 is set at m, this delay may be expressed as:

$$M=F+m$$

To provide a time delay ahead of the start time actually a time advance), the charging of the ramping capacitor is begun one (or more) T cycles ahead of the start time. If DAC 21 is set at m, this delay may be expressed as:

$$M=-F+m$$

By this method, the present invention maintains the same resolution continuously over the clock cycle.

It is not necessary for control block 29 to activate switches 22 and 23 with different timing signals because the inverses of the timing signals are also available. FIG. 4 provides an example of the use of complementary signals to control switches 22 and 23. The meaning of the traces are the same as those of FIG. 3. While switch 24 is setting initial voltage of threshold level capacitor 26, DAC current flows into voltage line 33. After switch 24 is opened, DAC 21 starts charging the threshold level capacitor 26. While switch 25 is setting the initial voltage of the ramping capacitor 27, DAC current also flows into voltage line 33. After switch 25 is open, DAC 21 starts charging the ramping capacitor 27.

Time interval T is defined as the time between the end time of setting the initial voltage of the threshold level capacitor 26, and the end time of charging the threshold level capacitor. It is also the period of the master clock used to control time delay. T is 1/N of the period of the data signal that is being synchronized. In one embodiment of the invention N=16 resulting in a master clock having a frequency 16 times that of the data signal.

Alternative embodiments of the present invention are illustrated in FIGS. 5A and 5B, and FIGS. 6A and 6B. Both alternative embodiments use a single capacitor and two DACs, rather than the two capacitors 26, 27 and one DAC 21 of the embodiment of FIG. 2A.

Figure 5A:
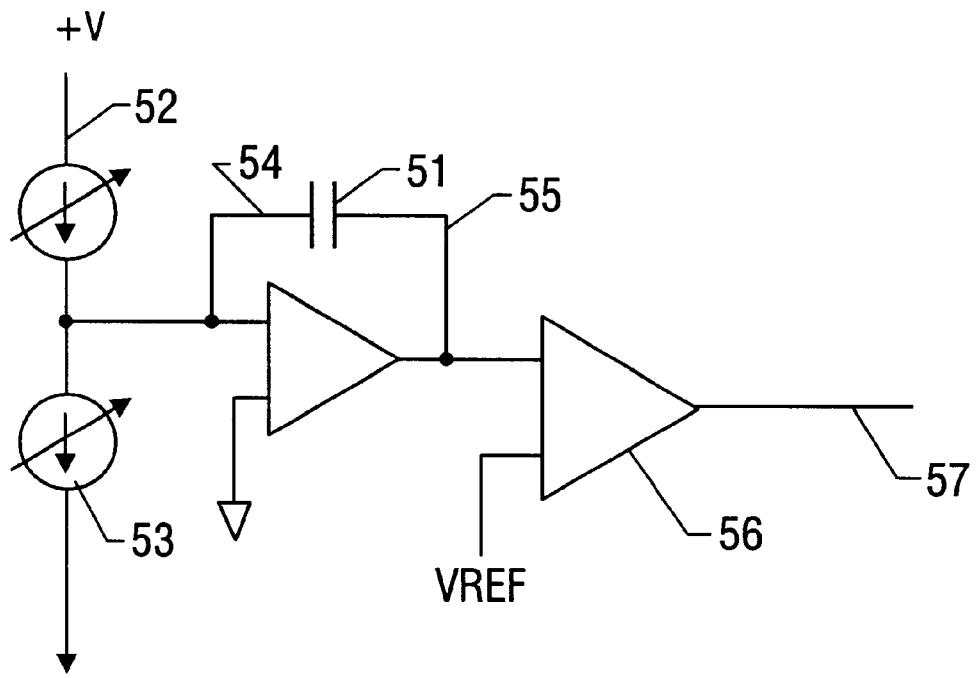
FIGS. 5A and 5B illustrate another embodiment of the present invention.
Figure 5B:
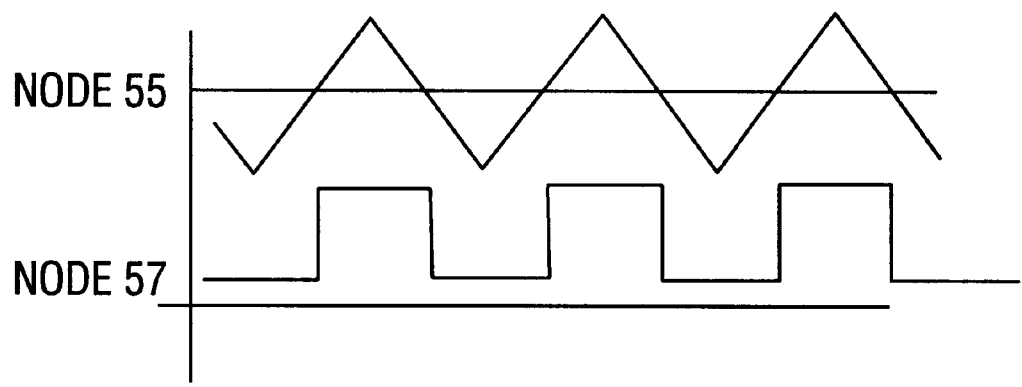

Referring to FIGS. 5A and 5B, controlled current is pulled into and out of node 54 under control of current DACs 52, 53 to generate a sawtooth waveform on node 55. Node 55 is compared to a predetermined threshold (possibly ground) by comparator 56 to generate a pulse on node 57 that has a controlled time delay.

Figure 6A:
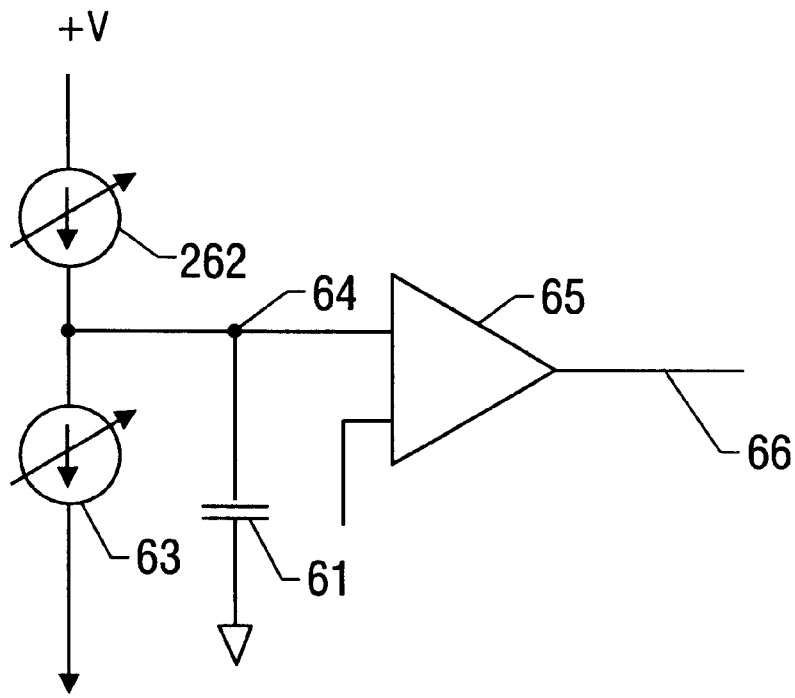
FIGS. 6A and 6B illustrate yet another embodiment of the present invention.
Figure 6B:
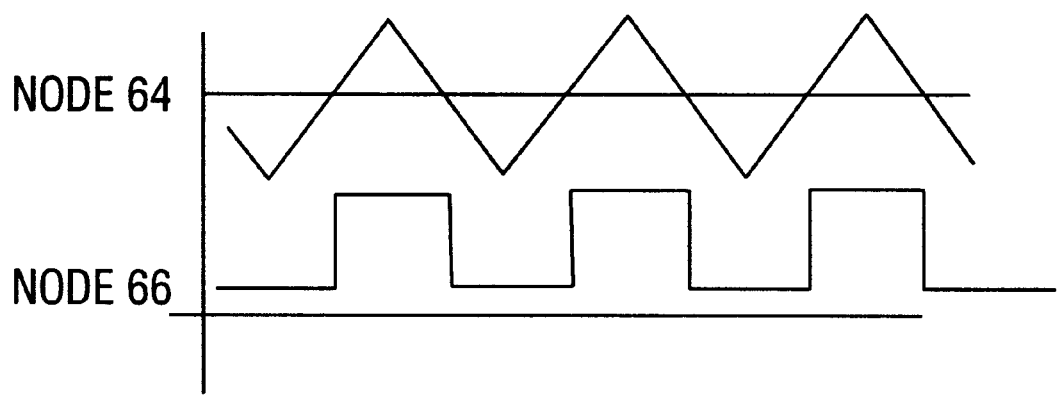

Referring to FIGS. 6A and 6B, DACs 62 and 63 are controlled to push current into and out of capacitor 61 thus creating a sawtooth waveform on node 64. Node 64 is compared to a predetermined reference by comparator 65 to generate a pulse on node 66 that has a controlled time delay.

The embodiments of FIGS. 5 and 6 avoid any deleterious effects of mismatched capacitors in the two capacitor embodiment of FIG. 2A. However, by using two DACs, the embodiments of FIGS. 5 and 6 are sensitive to the effects of mismatches between the unit currents of the DACS, a sensitivity that would not be present in the single-DAC embodiment of FIG. 2A.

While the present invention has been described with reference to several illustrative embodiments, it will be understood by those of ordinary skill in this technology that changes, additions or deletions may be made to the illustrated embodiments without departing from the scope of the invention.

What is claimed is:

1. A high resolution variable time delay circuit for producing a desired delay time equal to a coarse delay time added to a fine delay time, said coarse delay time being an integer multiple of a clock period T and said fine delay time being not greater than said clock period T, said circuit comprising:
    a discrete-valued variable current source that produces a current that is proportional to an input integer value F;
    a first capacitor charged by said discrete-valued variable current source for a duration of time set by said clock period T to provide a threshold voltage;
    a second capacitor having an initial charge and connected to have said initial charge changed by said discrete-valued variable current source after a delay equal to said coarse delay time, to provide a ramping voltage; and,
    a comparator connected to said first capacitor and said second capacitor for comparing said ramping voltage with said threshold voltage and for providing an output signal when said threshold voltage and said ramping voltage are substantially equal, to produce a delayed signal with a delay time within T/F seconds of said desired delay time.

2. The high resolution variable time delay circuit of claim 1, said first capacitor and said second capacitor having approximately equal capacitances.

3. The high resolution variable time delay circuit of claim 1, further comprising a control block, comprising:
    a clock signal input;
    a command signal input; and
    an accumulator for storing an accumulator value that is selectively increased or decreased by applying signals to said command signal input, said accumulator value controlling said discrete-valued variable current source.

4. The high resolution variable time delay circuit of claim 3, further comprising, a switch controlled by said control block to selectively connect said first capacitor to said discrete-valued variable current source.

5. The high resolution variable time delay circuit of claim 3, further comprising, a switch controlled by said control block to selectively connect said second capacitor to said discrete-valued variable current source.

6. The high resolution variable time delay circuit of claim 3, further comprising, a switch controlled by said control block to selectively connect said first capacitor to a voltage source to charge said first capacitor to a desired initial voltage.

7. The high resolution variable time delay circuit of claim 3, further comprising, a switch controlled by said control block to selectively connect said second capacitor to a voltage source to charge said second capacitor to a desired initial voltage.

8. The high resolution variable time delay circuit of claim 3, further comprising a switch controlled by said control block to selectively connect said first capacitor to ground.

9. The high resolution variable time delay circuit of claim 3, further comprising a switch controlled by said control block to selectively connect said second capacitor to ground.

10. The high resolution variable time delay circuit of claim 1, said discrete-valued variable current source comprising a DAC.

11. A high resolution variable time delay circuit for use with a digital circuit operating at clock period T, comprising:
    a discrete-valued variable current source responsive to an input integer value to produce output current that is proportional to said input integer value;
    a two-terminal electronic threshold element having a capacitance and charged for a duration of time set by said clock period T to provide a threshold voltage;
    a two-terminal electronic ramping element having a capacitance, having an initial charge, and connected to have said initial charge changed by an amount proportional to a ramping multiple F by said discrete-valued variable current source, to provide a ramping voltage; and
    a comparator, connected to said two-terminal electronic threshold element and said two-terminal electronic ramping element, for comparing said ramping voltage with said threshold voltage and for providing a high resolution delayed output signal, having a resolution proportional to said ramping multiple F and substantially finer than said clock period T, when said threshold voltage and said ramping voltage are substantially equal.

12. The high resolution variable time delay circuit of claim 11 wherein said two-terminal electronic threshold element and said two-terminal electronic ramping element have approximately equal capacitances.

13. The high resolution variable time delay circuit of claim 11, further comprising a control block comprising:
    a clock signal input;
    a command signal input; and
    an accumulator for storing an accumulator value that is selectively increased or decreased by applying signals to said command signal input, said accumulator value controlling said discrete-valued variable current source.

14. The high resolution variable time delay circuit of claim 11, wherein said two-terminal electronic threshold element and said two-terminal electronic ramping element are capacitors.

15. The high resolution variable time delay circuit of claim 11, wherein said two-terminal electronic threshold element is a MOS transistor with drain and source terminals electrically connected together, and said two-terminal electronic ramping element is a MOS transistor with drain and source terminals electrically connected together.

16. A method of generating a high resolution time delayed pulse, comprising:

provided a master clock signal with a clock period;

determining a desired delay time as a sum of a coarse delay time and a fine delay time, said coarse delay tie being a multiple of said clock period, and said fine delay time being not greater than said clock period;

establishing a first threshold voltage;

establishing a first ramping voltage;

determining a threshold multiple M and a ramping multiple F of a base current, said clock period multiplied by said threshold multiple M and divided by said ramping multiple F being substantially equal to said fine delay time;

changing said first threshold voltage by an amount proportional to the product of said threshold multiple M and said clock period to establish a second threshold voltage;

changing said first ramping voltage by application of a current proportional to said ramping multiple F to establish a second ramping voltage;

comparing said second ramping voltage to said second threshold voltage; and producing a delayed pulse when said second ramping voltage substantially equals said second threshold voltage.

17. The method of claim 16, further comprising, storing said ramping multiple F and said threshold multiple M.

18. The method of claim 16, wherein said second threshold voltage is greater than said first threshold voltage, and wherein said second ramping voltage is greater than said first ramping voltage.

19. The method of claim 16, wherein said second threshold voltage is less than said first threshold voltage, and wherein said second ramping voltage is less than said first ramping voltage.

20. A high resolution variable time delay circuit for use with a digital circuit operating at a clock period T, comprising:

a discrete-valued variable current source responsive to an input integer value to produce output current that is proportional to said input integer value;

a two-terminal electronic threshold element having a capacitance and charged for a duration of time set by said clock period T to provide a threshold voltage;

a two-terminal electronic ramping element having a capacitance, having an initial charge, and connected to have said initial charge changed by an amount proportional to a ramping multiple F by said discrete-valued variable current source, to provide a ramping voltage, said capacitance of said two terminal electronic threshold element being approximately equal to said capacitance of said two terminal electronic ramping element; and a comparator, connected to said two-terminal electronic threshold element and said two-terminal electronic ramping element, for comparing said ramping voltage with said threshold voltage and for providing a high resolution delayed output signal, having a resolution proportional to said ramping multiple F and substantially finer than said clock period T, when said threshold voltage and said ramping voltage are substantially equal.

21. A high resolution variable time delay circuit, comprising:

a discrete-valued variable current source responsive to an input integer value to produce output current that is proportional to said input integer value;

a two-terminal electronic threshold element having a capacitance and charged to provide a threshold voltage;

a two-terminal electronic ramping element having a capacitance, having an initial charge, and connected to have said initial charge changed by said discrete-valued variable current source, to provide a ramping voltage;

a comparator, connected to said two-terminal electronic threshold element and said two-terminal electronic ramping element, for comparing said ramping voltage with said threshold voltage and for providing a high resolution delayed output signal when said threshold voltage and said ramping voltage are substantially equal; and a control block comprising:
    a clock signal input;
    a command signal input; and
    an accumulator for storing an accumulator value that is selectively increased or decreased by applying signals to said command signal input, said accumulator value controlling said discrete-valued variable current source.

* * * * *